METHOD OF FABRICATING SEMICONDUCTOR DEVICE WHICH INCLUDES REGION IN WHICH MINORITY CARRIERS HAVE SHORT LIFETIME

Filed Sept. 28, 1964 2 Sheets-Sheet 1

INVENTORS
JAMES J. Mc MULLEN
DONALD M. BRETTNER
BY Jack M. Wiseman
ATTORNEY

March 24, 1970 J. J. McMULLEN ET AL 3,502,515

METHOD OF FABRICATING SEMICONDUCTOR DEVICE WHICH INCLUDES
REGION IN WHICH MINORITY CARRIERS
HAVE SHORT LIFETIME

Filed Sept. 28, 1964 2 Sheets-Sheet 2

INVENTORS
JAMES J. Mc MULLEN
DONALD M. BRETTNER

BY Jack M. Wiseman

ATTORNEY

United States Patent Office 3,502,515

Patented Mar. 24, 1970

3,502,515

METHOD OF FABRICATING SEMICONDUCTOR DEVICE WHICH INCLUDES REGION IN WHICH MINORITY CARRIERS HAVE SHORT LIFETIME

James J. McMullen and Donald M. Brettner, Sunnyvale, Calif., assignors, by mesne assignments, to Philco-Ford Corporation, a corporation of Delaware Filed Sept. 28, 1964, Ser. No. 399,583

Int. Cl. H01l 7/36

U.S. Cl. 148—175 8 Claims

ABSTRACT OF THE DISCLOSURE

Reduction of minority carrier lifetime in a selected region of an epitaxial layer of a semiconductor device is achieved by incorporating atoms of certain metals into said region. In one embodiment, molybdenum pentachloride, in vapor or powder form, is added to vapor or liquid silicon tetrachloride, which contains a suitable dopant such as boron tribromide or phosphorus trichloride. The resultant mixture is employed during epitaxial growth of the selected region of the epitaxial layer onto a silicon substrate in order to incorporate molybdenum atoms into said region. Other suitable metals are tantalum, iron, manganese, titanium, vanadium, and tungsten.

The present invention relates in general to a semiconductor device and method of fabricating the same, and more particularly to a semiconductor device with a reduced minority carrier lifetime and a method of fabricating semiconductor devices with localized minority carrier lifetime control.

In semiconductor devices employed for fast switching operations, it is desirable to have fast recovery junctions. This may be accomplished by providing selected regions within an epitaxial layer with a reduced minority carrier lifetime. Heretofore, such a reduction in minority carrier lifetime was achieved by highly doping the selected regions in the epitaxial layer. However, highly doped regions tend to reduce the breakdown voltage of the semiconductor device. Gold diffusion was also used to reduce minority carrier lifetime. However, gold diffusion is extremely difficult to localize.

An object of the present invention is to provide an improved process for fabricating semiconductor devices with fast recovery junctions.

Another object of the present invention is to provide a semiconductor device having an epitaxial layer with a selected region therein having a reduced minority carrier lifetime without making the selected region highly doped.

Another object of the present invention is to provide a semiconductor device having an epitaxial layer with a selected region therein having a reduced minority carrier lifetime without reducing the breakdown voltage of the semiconductor device.

Another object of the present invention is to provide a method for fabricating semiconductor devices that facilitates the forming of a selected or localized region in the epitaxial layer with a reduced minority carrier lifetime.

Other and further objects and advantages of the present invention will be apparent to one skilled in the art from the following description taken in conjunction with the accompanying drawings.

DRAWINGS

FIGS. 1–16 are sectional views through a semiconductor device at various stages of manufacture thereof in accordance with the present invention.

Figure 1:
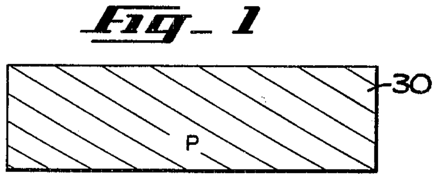

Illustrated in FIG. 1 is a P-type silicon semiconductor monocrystalline body or slice 30. Conventionally, the slice 30 is lapped, cleaned, degreased and chemically etched to remove lapping damage on the surface and to prepare the same for the succeeding step.

An oxide film, coating or layer 31 (FIG. 2) is then grown on the surface of the substrate 30; the layer 31 may be silicon oxide or silicon dioxide. As is well-known in the art, layer 31 may be grown in a furnace employing steam or dry oxygen as a suitable oxidizing agent or by the pyrolytic decomposition of siloxanes. Preferably, oxygen and wet inert gas are employed as oxidants.

Two portions of the oxide layer 31 are then removed (FIG. 3) by conventional techniques and processes such as photo-resist techniques or photolithography. Commonly used photosensitive materials which will serve as a mask against chemical etchants are KPR, KMER, and KPL, all of which are manufactured by the Eastman Kodak Company.

By way of illustration, a film of KPR (not shown) is applied to the oxide layer 31 and dried with air and heat to form a hard emulsion. While substrate 30 is held down by a vacuum a glass mask is aligned and lowered onto the substrate 30 and the assembly is retained in a jig. Now, the assembly is exposed to ultraviolet light, which penetrates the clear portion of the glass mask to polymerize selected portions of the KPR. The unexposed photosensitive material is unpolymerized and is removed by a suitable solvent.

Figure 3:
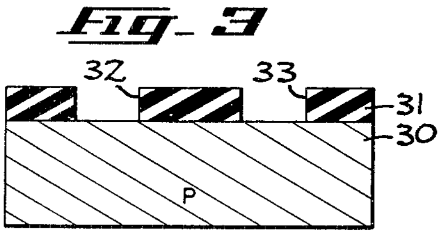

The assembly is then exposed to a suitable etchant, such as hydrofluoric acid to remove the portions of the oxide layer 31 not protected by the polymerized photosensitive material to form openings 32 and 33 (FIG. 3). Thus, the oxide layer 31 can now serve as a mask, as is well-known in the art, for the diffusion of N+ silicon collector regions in the P-type substrate 30.

Figures 2, 4, 6, 8, 10:
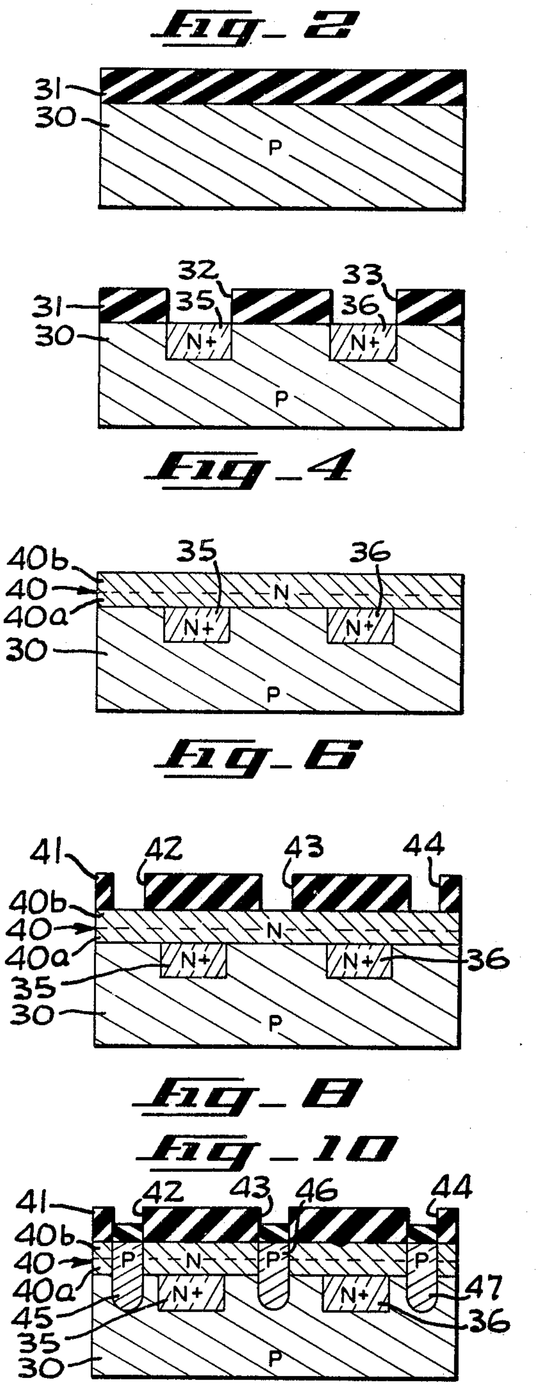

Toward this end, a suitable dopant, such as phosphorus or antimony, is diffused into the P-type substrate 30 to create N+ collector regions 35 and 36 (FIG. 4).

Figure 5:
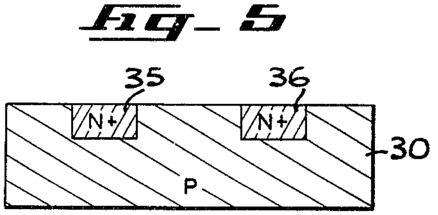
Figure 7:
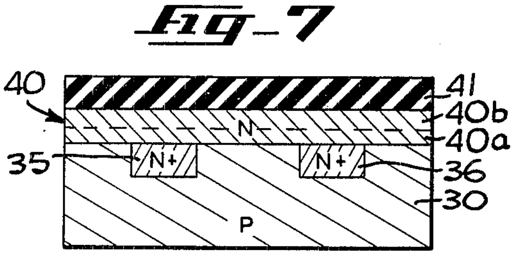
Figure 9:
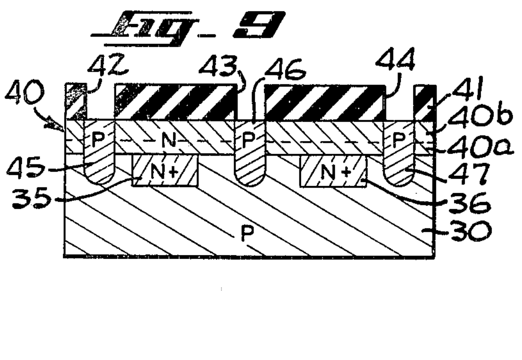
Figure 11:
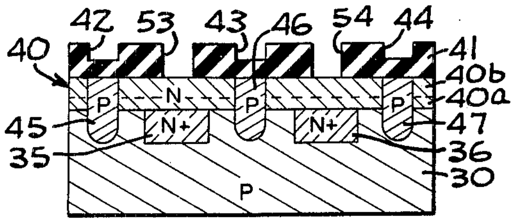

The oxide layer 31 is now removed in its entirety (FIG. 5).

A thin layer or coating of N-type silicon is then deposited or grown onto the upper surface of the wafer 30 to form an N-type silicon epitaxial layer 40 (FIG. 6).

According to the invention, a selected region of the epitaxial layer 40 is doped with a small amount of a metal, such as molybdenum, iron, manganese, tantalum, titanium, vanadium, or tungsten, in order to reduce the minority carrier lifetime thereof. In the preferred embodiment, a vapor deposition of a metal halide, such as molybdenum pentachloride, is employed. as indicated in FIG. 6, a selected region of the epitaxial layer 40 which is doped with the metal to reduce the minority carrier lifetime thereof can either be in a horizontal layer 40*a* adjacent substrate 30 or in a horizontal layer 40*b* at the upper surface of layer 40.

Should it be desired to have a low storage time collector junction and a high storage time emitter junction, then the portion 40*a* of the epitaxial layer 40 would be doped with the metal and the portion 40*b* of the epitaxial layer 40 would be free of the metal doping. Should it be desired to have a low storage time emitter junction and high storage time base junction, then the metal doped portion of the epitaxial layer 40 would be the portion 40*b*, while the portion 40*a* would be free of the metal doping. In practice, where the epitaxial layer 40 is 5 microns thick, the metal doped region would be approximately 2 microns thick and the region free from the metal doping would be 3 microns thick.

The carrier-lifetime-reducing metal can be provided in layer 40 by introducing, during a selected time interval during the growth of layer 40, a substantially pure metal halide vapor, such as molybdenum pentachloride, to a silicon tetrachloride vapor which includes as a dopant either a vapor of boron tribromide (P-type) or phosphorus trichloride (N-type). during the remaining period of the epitaxial growth only the vapor of the silicon tetrachloride flows with either the vapor of boron tribromide or phosphorus trichloride. The deposition temperature for the molybdenum pentachloride should be between 600 and 950° C. and concentration of the molybdenum pentachloride should be less than $10^{20}$ atoms per cubic centimeter of silicon of the epitaxial layer 40.

Typical conventional epitaxial growth systems are described in Patent No. 3,099,579, to W. G. Spitzer et al., July 30, 1963, entitled "Growing and Determining Epitaxial Layer Thickness" and in "Microelectronics," pp. 283–286 by Edward Koenjian (McGraw-Hill, 1963). To carry out the present invention, another flask may be added to the typical system to add a flow of vapor of molybdenum pentachloride to the usual vapors of silicon tetrachloride and its dopant (boron tribromide or phosphorous trichloride) for a selected interval according to where it is desired to provide the molybdenum-containing region in layer 40.

Next a layer of silicon oxide or silicon dioxide 41 (FIG. 7) is grown over the epitaxial layer 40.

Portions of the oxide layer 41 are then removed to form openings 42–44 (FIG. 8), thereby rendering the oxide layer 41 suitable as a mask for the diffusing procedure to follow.

P-type isolation grids 45–47 (FIG. 9) are next diffusion grown in the epitaxial layer 40. For this purpose, boron diffusion may be employed using boron tribromide as a source impurity which is metered directly into a carrier gas such nitrogen to reduce surface pitting. The diffusant temperature is in the vicinity of 1150° C. and the diffusant period is in the vicinity of 60 minutes, whereby the isolation grids 45–47 join and form a continuous material with the P-type substrate 30.

The N-P junction formed by the P-type isolation grids 45–47 with the N-type epitaxial layer 40 provides electrical isolation. Oxide layers (FIG. 10) are then grown over the P-type isolation grids 45–47.

Thereupon, portions of the oxide layer 41 are removed to form holes 53 and 54 (FIG. 11) for exposing the base diffusion areas.

Figure 12:
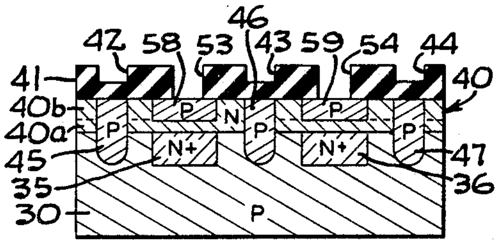
Figure 13:
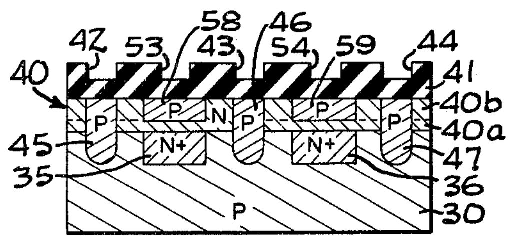
Figure 14:
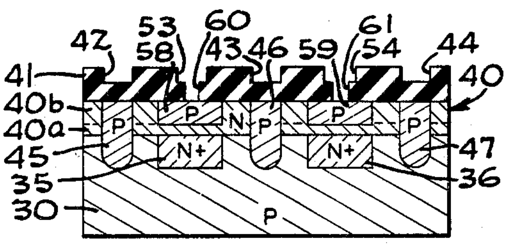
Figure 15:
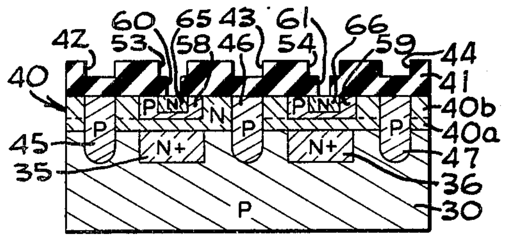
Figure 16:
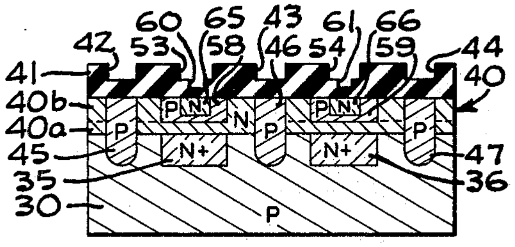

Next, as shown in FIG. 12, P-type regions 58 and 59 are diffused in the N-type epitaxial layer 40 to form the base regions. The base diffusion is similar to the isolation diffusion previously described in connection with the P-isolation grids 45-47 with the exception that a different surface concentration may be desired.

It should be noted that the P-type base regions formed in the epitaxial layer 40 extend through the layer **40*b*, which is not doped with a metal, into the layer 40*a***, which is doped with the metal. Thus, a low storage time base-collector junction is formed.

After oxide layers are regrown over the base diffusion openings (FIG. 13), portions of the oxide layer 41 are removed to form openings 60 and 61 (FIG. 14) for exposing the emitter diffusion openings.

N-type emitter regions 65–66 (FIG. 15) are diffused in the P-type regions 58 and 59. A suitable diffusant is phosphorus pentoxide which is supplied by a carrier gas, such as nitrogen, which flows over a source maintained at about 200° C. while the wafer is held at 1000 to 1200° C. A quartz wool filter removes particles picked up by the flowing gas stream, which stream passes over the silicon wafer.

Should it be desired to have a low storage time emitter-base junction, then the metal doped portion of the epitaxial layer would be the portion **40*b*, while the portion 40*a* would be free of the metal doping. The layer 40*b* would be approximately 40% of the depth of the epitaxial layer 40 and the emitter regions 65 and 66 would extend through the metal doped region 40*b* and terminate in the layer 40*a***.

Oxide layers (FIG. 16) are then re-grown on the N-type emitter regions 65 and 66. Aluminum bonding pads (not shown) are now attached to the base, emitter, and collector regions in conventional fashion, and the transistors are separated, if desired, provided with leads, and packaged in conventional fashion.

What is claimed is:

1. A method of making a semiconductor device which includes a region in which minority carriers have a short life-time in relation to their lifetime in any other region of said device, comprising: epitaxially growing from a vapor atmosphere a layer of semiconductor material onto a surface of a body of monocrystalline semiconductor material, and, during a selected interval of said growing, forming a discrete portion of said layer in part of atoms of a carrier lifetime reducing metal selected from the group consisting of molybdenum, iron, manganese, tantalum, titanium, vanadium, and tungsten by introducing during said interval a vapor of said metal into the vapor growth atmosphere.

2. The method of claim 1 wherein said forming of said discrete portion of said layer in part of atoms of a carrier lifetime reducing metal includes the introduction, solely during said selected interval, of a vapor of a halide of said metal into the epitaxial growth atmosphere to which said monocrystalline body is exposed during said growing.

3. The method of claim 1 wherein said selected interval of said forming begins at the start of said growing so that said region in which minority carriers have a short lifetime adjoins said surface of said monocrystalline body.

4. The method of claim 1 wherein said interval of said forming ends at the completion of said growing of said layer so that said region in which minority carriers have a short lifetime occupies the portion of said layer most remote from said surface of said monocrystalline body.

5. The method of claim 1 further comprising also forming said layer in part of atoms of a dopant of a given conductivity type by the introduction of a vapor comprising atoms of said dopant into the epitaxial growth atmosphere to which said monocrystalline body is exposed during said growing.

6. The method of claim 5 further including the step of diffusing atoms of a conductivity type opposite said given type into a portion of the surface of said layer to a given depth in said layer.

7. In the method of making a semiconductor device comprising:

epitaxially growing from a vapor atmosphere a layer of semiconductor material of one conductivity type onto a surface of a body of monocrystalline semiconductor material to form a monocrystalline layer of semiconductor material on said body, said layer having a planar major surface opposite said surface of said body, and diffusing a dopant of a conductivity type opposite said one type into at least one area of said major surface of said layer to form in said layer at least one region of said opposite conductivity type which extends from said area of said major surface of said layer to a given depth in said layer, the improvement wherein, during a selected interval of said growing of said layer, a discrete portion of said layer is formed in part of atoms of a carrier lifetime reducing metal selected from the group consisting of molybdenum, iron, manganese, tantalum, titanium, vanadium, and tungsten by introducing during said interval a vapor of said metal into the vapor growth atmosphere, said discrete portion having a boundary parallel to said major surface of said layer, said boundary being located at said given depth in said layer.

8. The method of claim 7 wherein said forming of said discrete portion of said layer in part of atoms of a carrier lifetime reducing metal includes the introduction, solely during said selected interval, of a vapor of a halide of said metal into the epitaxial growth atmosphere to which said monocrystalline body is exposed during said growing.

References Cited

UNITED STATES PATENTS

| | | | |
|---|---|---|---|
| 3,067,485 | 12/1962 | Ciccoella et al. | 148—186 XR |
| 3,108,914 | 10/1963 | Hoerny | 148—186 |
| 3,168,422 | 2/1965 | Allegretti et al. | 148—175 |
| 3,173,814 | 3/1965 | Law | 148—175 |
| 3,188,230 | 6/1965 | Bakish et al. | 117—107.2 |
| 3,208,888 | 9/1965 | Ziegler et al. | 148—174 XR |
| 2,774,695 | 12/1956 | Burton | 148—1.5 |

L. DEWAYNE RUTLEDGE, Primary Examiner

W. G. SABA, Assistant Examiner

U.S. Cl. X.R.

117—106, 107.2; 148—17.4, 1.5; 317—234